US009644285B2

United States Patent
Bertram, Jr.

(10) Patent No.: US 9,644,285 B2
(45) Date of Patent: May 9, 2017

(54) DIRECT LIQUID INJECTION FOR HALIDE VAPOR PHASE EPITAXY SYSTEMS AND METHODS

(75) Inventor: Ronald Thomas Bertram, Jr., Mesa, AZ (US)

(73) Assignee: SOITEC, Bernin (FR)

( * ) Notice: Subject to any disclaimer, the term of this patent is extended or adjusted under 35 U.S.C. 154(b) by 575 days.

(21) Appl. No.: 13/591,803

(22) Filed: Aug. 22, 2012

(65) Prior Publication Data
US 2013/0047917 A1     Feb. 28, 2013

Related U.S. Application Data

(60) Provisional application No. 61/526,148, filed on Aug. 22, 2011.

(51) Int. Cl.
*C30B 23/00*      (2006.01)
*C30B 29/40*      (2006.01)
(Continued)

(52) U.S. Cl.
CPC .......... *C30B 23/005* (2013.01); *C23C 16/303* (2013.01); *C23C 16/4486* (2013.01);
(Continued)

(58) Field of Classification Search
CPC combination set(s) only.
See application file for complete search history.

(56) References Cited

U.S. PATENT DOCUMENTS 5,370,738 A    12/1994    Watanabe et al.
5,372,754 A *   12/1994    Ono ............................ 261/142
(Continued)

FOREIGN PATENT DOCUMENTS

CN      101328579 A      12/2008
CN      101511460 A      8/2009
(Continued)

OTHER PUBLICATIONS

International Preliminary Report on Patentability for International Application PCT/IB2012/001485 dated Feb. 25, 2014, 6 pages.
(Continued)

*Primary Examiner* — Duy Deo
*Assistant Examiner* — Erin Bergner
(74) *Attorney, Agent, or Firm* — TraskBritt

(57) ABSTRACT

Methods of depositing compound semiconductor materials on one or more substrates include metering and controlling a flow rate of a precursor liquid from a precursor liquid source into a vaporizer. The precursor liquid may comprise at least one of $GaCl_3$, $InCl_3$, and $AlCl_3$ in a liquid state. The precursor liquid may be vaporized within the vaporizer to form a first precursor vapor. The first precursor vapor and a second precursor vapor may be caused to flow into a reaction chamber, and a compound semiconductor material may be deposited on a surface of a substrate within the reaction chamber from the precursor vapors. Deposition systems for performing such methods include devices for metering and/ or controlling a flow of a precursor liquid from a liquid source to a vaporizer, while the precursor liquid remains in the liquid state.

22 Claims, 8 Drawing Sheets

(51) Int. Cl.
*C23C 16/30* (2006.01)
*C23C 16/448* (2006.01)
*C23C 16/455* (2006.01)

(52) U.S. Cl.
CPC .... *C23C 16/4557* (2013.01); *C23C 16/45504* (2013.01); *C30B 29/403* (2013.01)

(56) References Cited

U.S. PATENT DOCUMENTS

| | | | |
|---|---|---|---|
| 5,383,970 A * | 1/1995 | Asaba et al. | 118/726 |
| 5,480,678 A | 1/1996 | Rudolph et al. | |
| 5,589,110 A | 12/1996 | Motoda et al. | |
| 5,968,594 A | 10/1999 | Hu et al. | |
| 6,179,913 B1 | 1/2001 | Solomon et al. | |
| 6,301,434 B1 | 10/2001 | McDiarmid et al. | |
| 7,482,674 B1 | 1/2009 | Freitas et al. | |
| 8,133,806 B1 | 3/2012 | Werkhoven | |
| 2005/0051102 A1 | 3/2005 | Sato | |
| 2007/0138505 A1 | 6/2007 | Preble et al. | |
| 2007/0165356 A1 | 7/2007 | Nguyen et al. | |
| 2007/0254100 A1 | 11/2007 | Nijhawan et al. | |
| 2007/0256636 A1 | 11/2007 | Miller et al. | |
| 2008/0210163 A1 | 9/2008 | Carlson et al. | |
| 2008/0314311 A1 | 12/2008 | Burrows et al. | |
| 2009/0178611 A1 | 7/2009 | Arena et al. | |
| 2009/0184398 A1 | 7/2009 | Choi | |
| 2009/0205563 A1 * | 8/2009 | Arena | C23C 16/303 117/102 |
| 2009/0214785 A1 | 8/2009 | Arena et al. | |
| 2009/0223442 A1 | 9/2009 | Arena et al. | |
| 2009/0223453 A1 | 9/2009 | Arena et al. | |
| 2010/0063753 A1 | 3/2010 | Bour et al. | |
| 2010/0075488 A1 | 3/2010 | Collins et al. | |
| 2010/0116207 A1 | 5/2010 | Givens et al. | |
| 2010/0120259 A1 | 5/2010 | Vatus et al. | |
| 2010/0166955 A1 | 7/2010 | Becker et al. | |
| 2010/0227046 A1 | 9/2010 | Kato et al. | |
| 2010/0258053 A1 | 10/2010 | Arena et al. | |
| 2010/0273291 A1 | 10/2010 | Kryliouk et al. | |
| 2011/0253044 A1 | 10/2011 | Tam et al. | |
| 2011/0308453 A1 | 12/2011 | Su et al. | |
| 2012/0083100 A1 | 4/2012 | Bertram, Jr. | |
| 2013/0047918 A1 | 2/2013 | Bertram, Jr. et al. | |
| 2013/0052333 A1 | 2/2013 | Lindow et al. | |
| 2013/0052806 A1 | 2/2013 | Bertram, Jr. et al. | |
| 2013/0244410 A1 | 9/2013 | Arena et al. | |

FOREIGN PATENT DOCUMENTS

| | | |
|---|---|---|
| JP | 01268120 A | 10/1989 |
| JP | 03216526 A | 9/1991 |
| JP | 04056126 A | 2/1992 |
| JP | 06002147 A | 1/1994 |
| JP | 07335582 A | 12/1995 |
| JP | 08097167 A | 4/1996 |
| JP | 08162423 A | 6/1996 |
| JP | 08330318 A | 12/1996 |
| JP | 097232297 A | 9/1997 |
| JP | 2007005399 A | 1/2007 |
| JP | 2011524648 A | 9/2011 |
| WO | 2004025716 A1 | 3/2004 |
| WO | 2005017988 A1 | 2/2005 |
| WO | 2008023697 A1 | 2/2008 |
| WO | 2008064083 A2 | 5/2008 |
| WO | 2009082608 A1 | 7/2009 |
| WO | 2010005620 A2 | 1/2010 |
| WO | 2010023516 A1 | 3/2010 |
| WO | 2010101715 A1 | 9/2010 |
| WO | 2010103487 A1 | 9/2010 |
| WO | 2012037376 A2 | 3/2012 |
| WO | 2013182880 A2 | 12/2013 |

OTHER PUBLICATIONS

Chason, Eric, Resolution and Sensitivity of Stress Measurements with the k-Space Multi-beam Optical Sensor (MOS) System, Sandia National Laboratories, May 19, 2004, 11 pages.

Chason, Eric, Use of KSA MOS System for Stress and Thickness Monitoring During CVD Growth, Brown University, Apr. 2000., 8 pages.

Floro et al., Curvature-Based Techniques for Real-Time Stress Measurement During Thin Film Growth, in In Situ and Real Time Characterization of Thin Films, Orlando Auciello and Alan R. Krauss, eds. (John Wiley and Sons, NY 2001), pp. 191-216 (included in attached 49 pages).

UQG Optics, "Quartz Rod," <<http://www.uqgoptics.com/materials_optical_GE214.aspx>> 1999, 1 page.

Corning, Semiconductor Optics, "HPFS Fused Silica Standard Grade," <<www.corning.com>> Sep. 30, 2003, 4 pages.

Arena et al., U.S. Appl. No. 61/416,525, filed Nov. 23, 2010 and entitled "Methods of Forming Bulk III-Nitride Materials on Metal-Nitride Growth Template Layers, and Structures Formed by Such Methods".

Bertram et al., U.S. Appl. No. 61/526,137, filed Aug. 22, 2011 entitled "Deposition Systems Having Access Gates at Desirable Locations, and Related Methods".

Bertram et al., U.S. Appl. No. 61/526,143, filed Aug. 22, 2011 entitled "Deposition Systems Including a Precursor Gas Furnace Within a Reaction Chamber, and Related Methods".

Bour et al., Simple Technique for Measuring the Filled Volume of Liquid or Solid CVD Precursor Chemicals in Bubblers, Journal of Crystal Growth, Elsevier, Amsterdam, NL, vol. 310, No. 10, May 1, 2008, pp. 2673-2677.

Brooks Instrument, Liquid Vaporizer Systems, Breakthrough Vaporization Solutions for All Liquid-to-Vapor Applications, www.BrooksInstrument.com, 2011, 6 pages.

Elijah, Maximizing Epitaxial Deposit Uniformity, IBM Technical Disclosure Bulletin, vol. 14, No. 2, Jul. 1971, pp. 593-594.

International Search Report for International Application No. PCT/IB2012/001485 dated Sep. 24, 2012, 5 pages.

International Written Opinion for International Application No. PCT/IB2012/001485 dated Sep. 24, 2012, 6 pages.

Chinese Office Action and Search Report for Chinese Application No. 201280040542.0 dated May 27, 2015, 9 pages.

Gu et al., Inorganic Chemical Series, Science Press, vol. 2, Oct. 31, 1998, pp. 546.

Chinese Office Action for Chinese Application No. 201280040542.0 dated May 26, 2016, 20 pages with translation.

CN Office Action for for Chinese Application No. 201280040542.0 dated Dec. 9, 2015, 7 pages.

* cited by examiner

DIRECT LIQUID INJECTION FOR HALIDE VAPOR PHASE EPITAXY SYSTEMS AND METHODS

CROSS-REFERENCE TO RELATED APPLICATIONS

This application claims the benefit of U.S. Provisional Patent Application Ser. No. 61/526,148, filed Aug. 22, 2011. The subject matter of this application is related to the subject matter of U.S. patent application Ser. No. 14/401,261, pending, filed Nov. 14, 2014, the subject matter of U.S. patent application Ser. No. 13/327,302, pending, filed Dec. 15, 2011, the subject matter of U.S. patent application Ser. No. 13/591,718, now abandoned, filed filed Aug. 22, 2012, and the subject matter of U.S. patent application Ser. No. 13/591,761, pending, filed Aug. 22, 2012, the entire disclosure of each of which application is incorporated herein in its entirety by this reference.

FIELD

Embodiments of the invention generally relate to systems for depositing materials on substrates, and to methods of making and using such systems. More particularly, embodiments of the invention relate to methods and systems that may be used to deposit compound semiconductor materials, such as III-V semiconductor materials, using chemical vapor deposition (CVD).

BACKGROUND

Chemical vapor deposition (CVD) is a chemical process that is used to deposit solid materials on substrates, and is commonly employed in the manufacture of semiconductor devices. In chemical vapor deposition processes, a substrate is exposed to one or more reagent gases, which react, decompose, or both react and decompose in a manner that results in the deposition of a solid material on the surface of the substrate.

One particular type of CVD process is referred to in the art as vapor phase epitaxy (VPE). In VPE processes, a substrate is exposed to one or more reagent vapors in a reaction chamber, which react, decompose, or both react and decompose in a manner that results in the epitaxial deposition of a solid material on the surface of the substrate. VPE processes are often used to deposit III-V semiconductor materials. When one of the reagent vapors in a VPE process comprises a halide vapor, the process may be referred to as a halide vapor phase epitaxy (HVPE) process.

HVPE processes are used to form III-V semiconductor materials such as, for example, gallium nitride (GaN). In such processes, epitaxial growth of GaN on a substrate results from a vapor phase reaction between gallium chloride (GaCl) and ammonia ($NH_3$) that is carried out within a reaction chamber at elevated temperatures between about 500° C. and about 1,000° C. The $NH_3$ may be supplied from a standard source of $NH_3$ gas.

In some methods, the GaCl vapor is provided by passing hydrogen chloride (HCl) gas (which may be supplied from a standard source of HCl gas) over heated liquid gallium (Ga) to form GaCl in situ within the reaction chamber. The liquid gallium may be heated to a temperature of between about 750° C. and about 850° C. The GaCl and the $NH_3$ may be directed to (e.g., over) a surface of a heated substrate, such as a wafer of semiconductor material. U.S. Pat. No. 6,179,913, which issued Jan. 30, 2001 to Solomon et al., discloses a gas injection system for use in such systems and methods.

Additional methods and systems have been developed that utilize an external source of a $GaCl_3$ precursor, which is directly injected into the reaction chamber. Examples of such methods and systems are disclosed in, for example, United States (U.S.) Patent Application Publication No. US 2009/0223442 A1, which published Sep. 10, 2009 in the name of Arena et al., the entire disclosure of which publication is incorporated herein by reference.

Previously known deposition systems employ mass flow controllers that meter and control the flow of the process gases in the gas or vapor state into the reaction chamber.

BRIEF SUMMARY

This summary is provided to introduce a selection of concepts in a simplified form, such concepts being further described in the detailed description below of some example embodiments of the invention. This summary is not intended to identify key features or essential features of the claimed subject matter, nor is it intended to be used to limit the scope of the claimed subject matter.

In some embodiments, the present disclosure includes methods of depositing compound semiconductor materials on one or more substrates. For example, such methods may include metering and controlling a flow rate of a precursor liquid from a source of the precursor liquid into a vaporizer. The precursor liquid may comprise at least one of $GaCl_3$, $InCl_3$, and $AlCl_3$ in a liquid state. The precursor liquid may be vaporized within the vaporizer to form a first precursor vapor. The first precursor vapor may be caused to flow out from the vaporizer to a region proximate a surface of a workpiece substrate within a reaction chamber. A second precursor vapor may be caused to flow into the reaction chamber separately from the first precursor vapor. A compound semiconductor material may be deposited on the surface of the workpiece substrate within the reaction chamber. The compound semiconductor material may comprise at least one element from the first precursor vapor and at least one element from the second precursor vapor.

In additional embodiments, the present disclosure includes halide vapor phase epitaxy systems that may be used to conduct methods as disclosed herein. For example, a halide vapor phase epitaxy system may comprise a reaction chamber, a source of at least one precursor liquid, and a vaporizer configured to vaporize the precursor liquid to faun a precursor vapor to be conveyed to a location proximate a substrate support structure within the reaction chamber. The precursor liquid may comprise at least one of $GaCl_3$, $InCl_3$, and $AlCl_3$ in a liquid state. At least one conduit may provide a fluid pathway between the source of the precursor liquid and the vaporizer. The system may further include a device configured to meter a flow rate of the precursor liquid through the at least one conduit, and a device configured to control the flow rate of the precursor liquid through the at least one conduit.

DETAILED DESCRIPTION OF EMBODIMENTS OF THE INVENTION

The illustrations presented herein are not meant to be actual views of any particular system, component, or device, but are merely idealized representations that are employed to describe embodiments of the present invention.

As used herein, the term "III-V semiconductor material" means and includes any semiconductor material that is at least predominantly comprised of one or more elements from group IIIA of the periodic table (B, Al, Ga, In, and Ti) and one or more elements from group VA of the periodic table (N, P, As, Sb, and Bi). For example, III-V semiconductor materials include, but are not limited to, GaN, GaP, GaAs, InN, InP, InAs, AlN, AlP, AlAs, InGaN, InGaP, InGaNP, etc.

Improved gas injectors have recently been developed for use in methods and systems that utilize an external source of a $GaCl_3$ precursor that is injected into the reaction chamber, such as those disclosed in the aforementioned U.S. Patent Application Publication No. US 2009/0223442 A1. Examples of such gas injectors are disclosed in, for example, U.S. Provisional Patent Application Ser. No. 61/157,112, which was filed on Mar. 3, 2009 in the name of Arena et al., the entire disclosure of which application is incorporated herein in its entirety by this reference. As used herein, the term "gas" includes gases (fluids that have neither independent shape nor volume) and vapors (gases that include diffused liquid or solid matter suspended therein), and the terms "gas" and "vapor" are used synonymously herein.

Embodiments of the present invention include, and make use of, deposition systems configured to perform a halide vapor phase epitaxy deposition process wherein the flow of one or more precursor substances into the reaction chamber is metered and/or controlled in the liquid state, prior to being vaporized to form one or more precursor vapors employed in the deposition process.

Figure 1A:
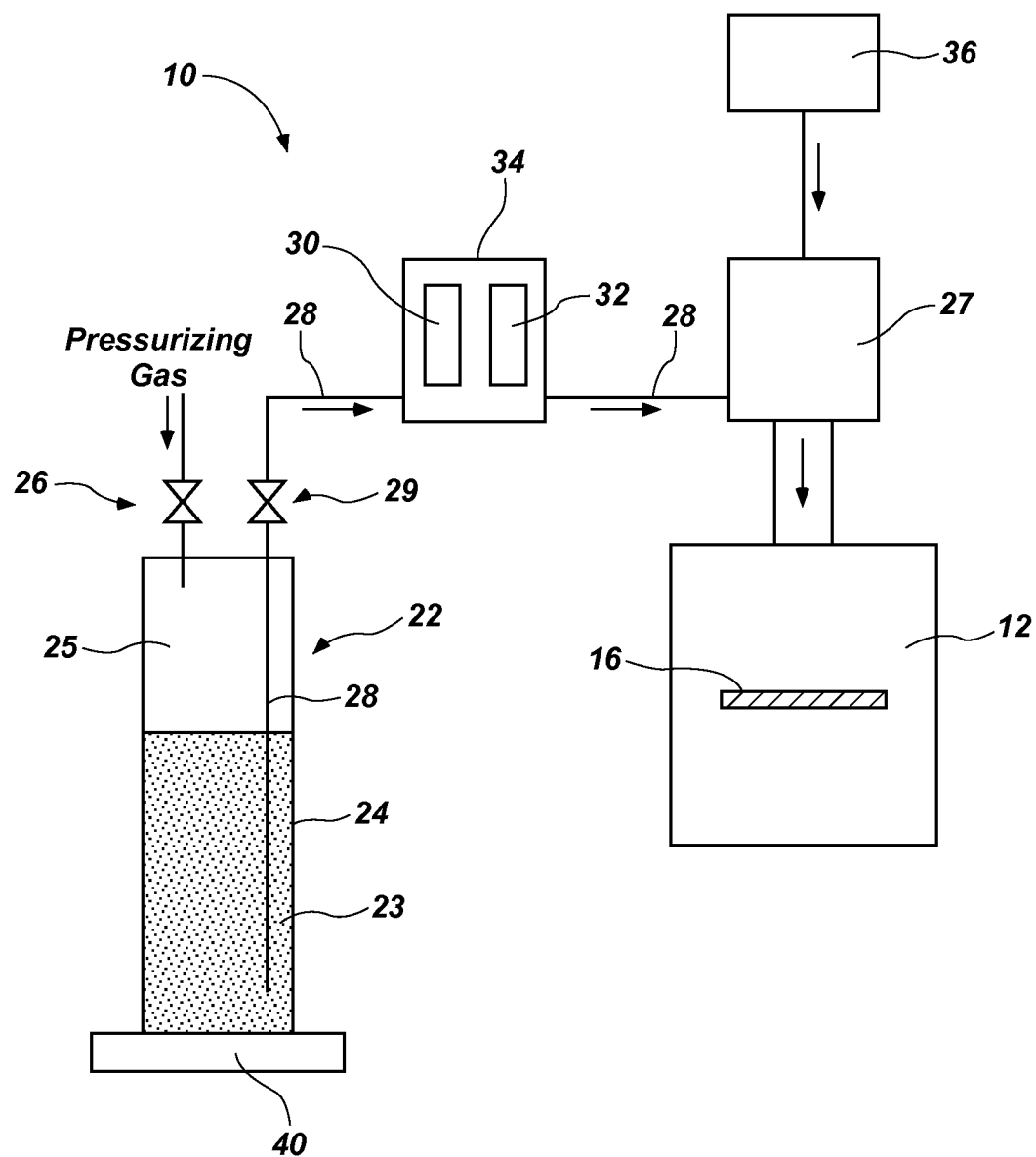
FIG. 1A is a schematic diagram illustrating an example embodiment of a deposition system in accordance with the present disclosure and including means for measuring and controlling flow of precursor substances into a reaction chamber while the precursor substances are in a liquid state.

FIG. 1A schematically illustrates an example of such a deposition system 10. The deposition system 10 may comprise a CVD system, and may comprise a VPE deposition system (e.g., an HVPE deposition system). The deposition system 10 includes a reaction chamber 12, in which a material (e.g., semiconductor material) may be deposited onto a workpiece substrate 16. A substrate support structure (not shown in FIG. 1A) may be disposed within the reaction chamber 12 for supporting the workpiece substrate 16 on which material is to be deposited. The deposition system 10 further includes a source 22 of a precursor liquid 23. The precursor liquid 23 comprises a substance that includes elements that are to be incorporated into the material to be deposited on the workpiece substrate 16. The source 22 of the precursor liquid 23 may comprise, for example, a container 24 in which precursor liquid 23 is disposed.

As a non-limiting example, the material to be deposited onto the workpiece substrate 16 may comprise a III-V semiconductor material, such as one or more of GaN, InN, AlN and alloys and mixtures thereof. The precursor liquid 23 then may comprise one or more substances including at least one group III element, such as one or more of $GaCl_3$, $InCl_3$, and $AlCl_3$ in the liquid state. The deposition system 10 may comprise sources of other precursor substances (not shown in FIG. 1A). For example, the deposition system 10 may include a source of a precursor vapor comprising nitrogen (e.g., ammonia), which is a group V element that, together with the group III element may form a III-V nitride material on the workpiece substrate 16 within the reaction chamber 12.

As one particular non-limiting embodiment, the precursor liquid 23 may comprise liquid $GaCl_3$. $GaCl_3$ is a liquid at temperatures between about 83° C. and about 120° C. at atmospheric pressure, and may be a liquid at temperatures up to about 150° C. at higher pressures. Thus, in embodiments in which the precursor liquid 23 comprises liquid $GaCl_3$, one or more heating elements 40 may be used to maintain the source 22 of precursor liquid 23 at a temperature within a range extending from about 83° C. to about 150° C.

As shown in FIG. 1A, the precursor liquid 23 may be pressurized within the container 24 using a pressurizing gas to pressurize a volume of space 25 over the precursor liquid 23 within the container 24. One or more flow control valves 26 may be used to control the flow of the pressurizing gas into the container 24, and, hence, to control the pressure of the precursor liquid 23.

The deposition system 10 further includes a vaporizer 27 that is configured to vaporize the precursor liquid 23 to form a precursor vapor to be conveyed to a location proximate the workpiece substrate 16 (and the substrate support structure on which the workpiece substrate 16 is disposed) within the reaction chamber 12.

The vaporizer 27 may include one or more heating elements used for heating the precursor liquid 23 within the vaporizer 27 to form a precursor vapor from the precursor liquid 23. Optionally, the vaporizer 27 also may use physical means to assist the vaporization of the precursor liquid 23 therein. For example, the vaporizer 27 may impart ultrasonic vibrations to the precursor liquid 23 to enhance the vaporization of the precursor liquid 23 therein. In additional embodiments, the vaporizer 27 may comprise an atomizer or nebulizer configured to disperse the precursor liquid 23 into fine droplets within the vaporizer 27. For example, a source 36 of an atomizing gas may be used to supply pressurized atomizing gas to the vaporizer 27, where it may be used to disperse the precursor liquid 23 into fine droplets. The atomizing gas may comprise a carrier gas, such as helium (He), nitrogen ($N_2$), hydrogen ($H_2$), argon (Ar), etc., which may be inert in some embodiments. By way of example, vaporizers that may be used for the vaporizer 27 of the deposition system 10 are commercially available from Brooks Instrument of Hatfield, Pa.

A conduit 28 provides a fluid pathway between the source 22 of the precursor liquid 23 and the vaporizer 27. One or more valves 29 may be used to selectively enable and restrict the flow of the precursor liquid 23 through the conduit 28.

With continued reference to FIG. 1A, the deposition system 10 further includes a meter device 30 configured to measure a flow rate of the precursor liquid 23 through the conduit 28 as the precursor liquid 23 flows between the source 22 and the vaporizer 27, and a flow control device 32 configured to control the flow rate of the precursor liquid 23 through the conduit 28. The meter device 30 and the flow control device 32 may comprise electromechanical devices that are operated under control of a computer control system 34. For example, the computer control system 34 may be configured to flow the precursor liquid 23 through the conduit 28 within a desirable range so as to provide a desired mass flow of the precursor substance into the reaction chamber 12. The computer control system 34 may measure the flow of the precursor liquid 23 through the conduit 28 using the meter device 30, and, responsive to the measurements received from the meter device 30, selectively adjust the flow of the precursor liquid 23 through the conduit 28 responsive to the received measurements as needed to maintain the flow rate within the desirable range.

In some embodiments, the meter device 30 and the flow control device 32 may be integrated into a single unitary device. In other embodiments, the meter device 30 and the flow control device 32 may be distinct devices that are separate from one another. By way of example, meter devices and flow control devices that may be used for the meter device 30 and the flow control device 32 are commercially available from Brooks Instrument of Hatfield, Pa.

The precursor liquid 23 may be at a temperature of between about 83° C. and about 150° C. when it enters the vaporizer 27. The vaporizer 27 vaporizes the precursor liquid 23 to form a precursor vapor, as previously discussed. The precursor vapor may be at a temperature of between about 120° C. and about 900° C. as the precursor vapor exits the vaporizer 27. In some embodiments, the precursor vapor may be at least about 150° C. as it exits the vaporizer 27, at least about 400° C. as it exits the vaporizer 27, or even as high as about 900° C. as it exits the vaporizer 27. In some embodiments, a precursor gas furnace may be used to further heat the precursor vapor after it exits the vaporizer 27 and prior to reaching the workpiece substrate 16, as discussed in further detail below.

Additional heating elements (not shown) may be used to heat one or more sections of the conduit 28 between the source 22 of the precursor liquid 23 and the vaporizer 27 so as to maintain the temperature of the precursor liquid 23 between about 83° C. and about 150° C. until it reaches the vaporizer 27. Further, it may be desirable to avoid decreases in temperature within the precursor liquid 23, as the precursor liquid 23 flows from the source 22 to the vaporizer 27. Thus, heating elements may be provided along the conduit 28 so as to increase the temperature of the precursor liquid 23 (either in a gradual, continuous manner or in a stepwise manner) as the precursor liquid 23 flows from the source 22 to the vaporizer 27.

Figure 1B:
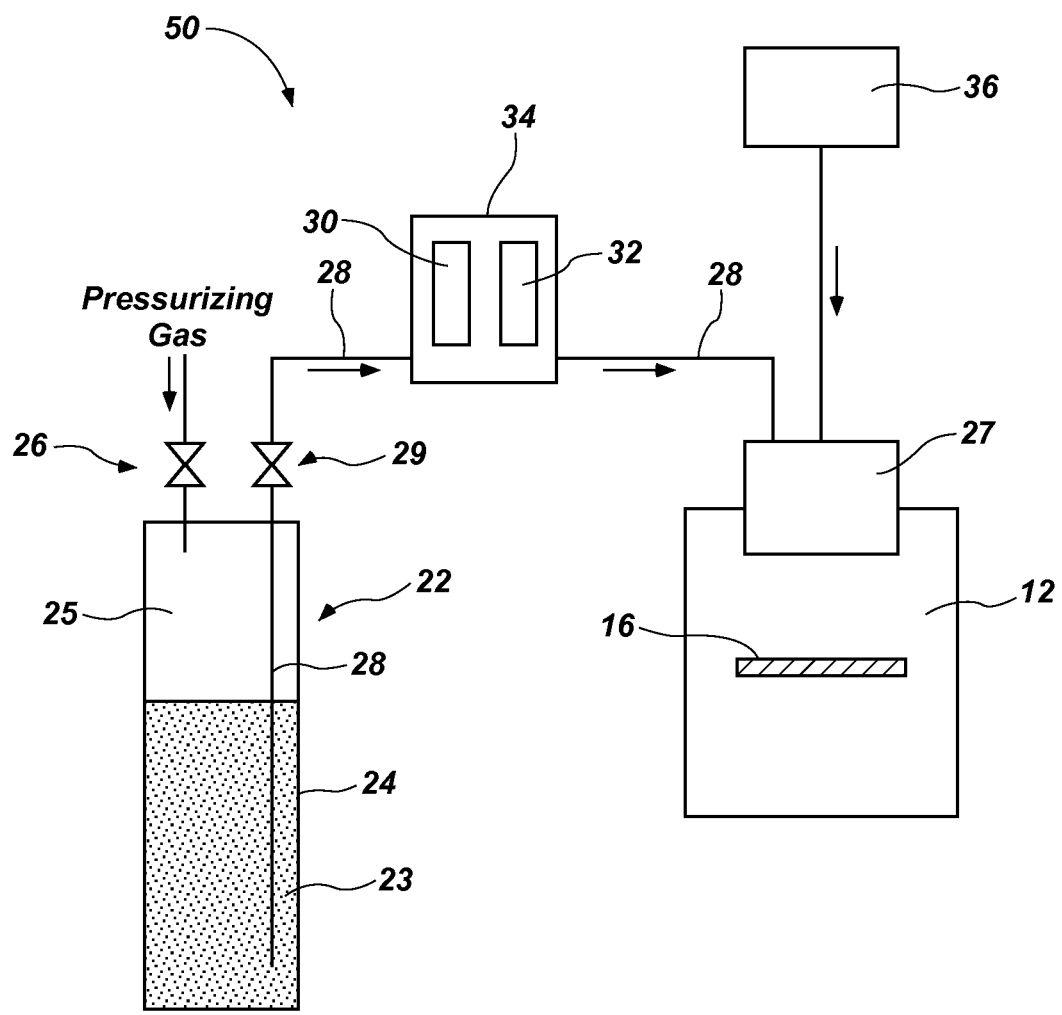
FIG. 1B is a schematic diagram illustrating another example embodiment of a deposition system in accordance with the present disclosure.

As shown in FIG. 1A, in some embodiments, the vaporizer 27 may be disposed outside the reaction chamber 12. In other embodiments, however, the vaporizer 27 may be disposed at least partially within the reaction chamber 12. For example, FIG. 1B illustrates another deposition system 50 that is substantially similar to the deposition system 10 of FIG. 1A, but wherein the vaporizer 27 is disposed partially within the reaction chamber 12. In yet further embodiments, the vaporizer 27 could be disposed entirely within the reaction chamber 12. In embodiments in which the vaporizer 27 may be disposed at least partially within the reaction chamber 12, the vaporizer 27 may be fabricated from materials that are capable of withstanding the temperatures and chemical environments within the reaction chamber 12.

Figure 2:
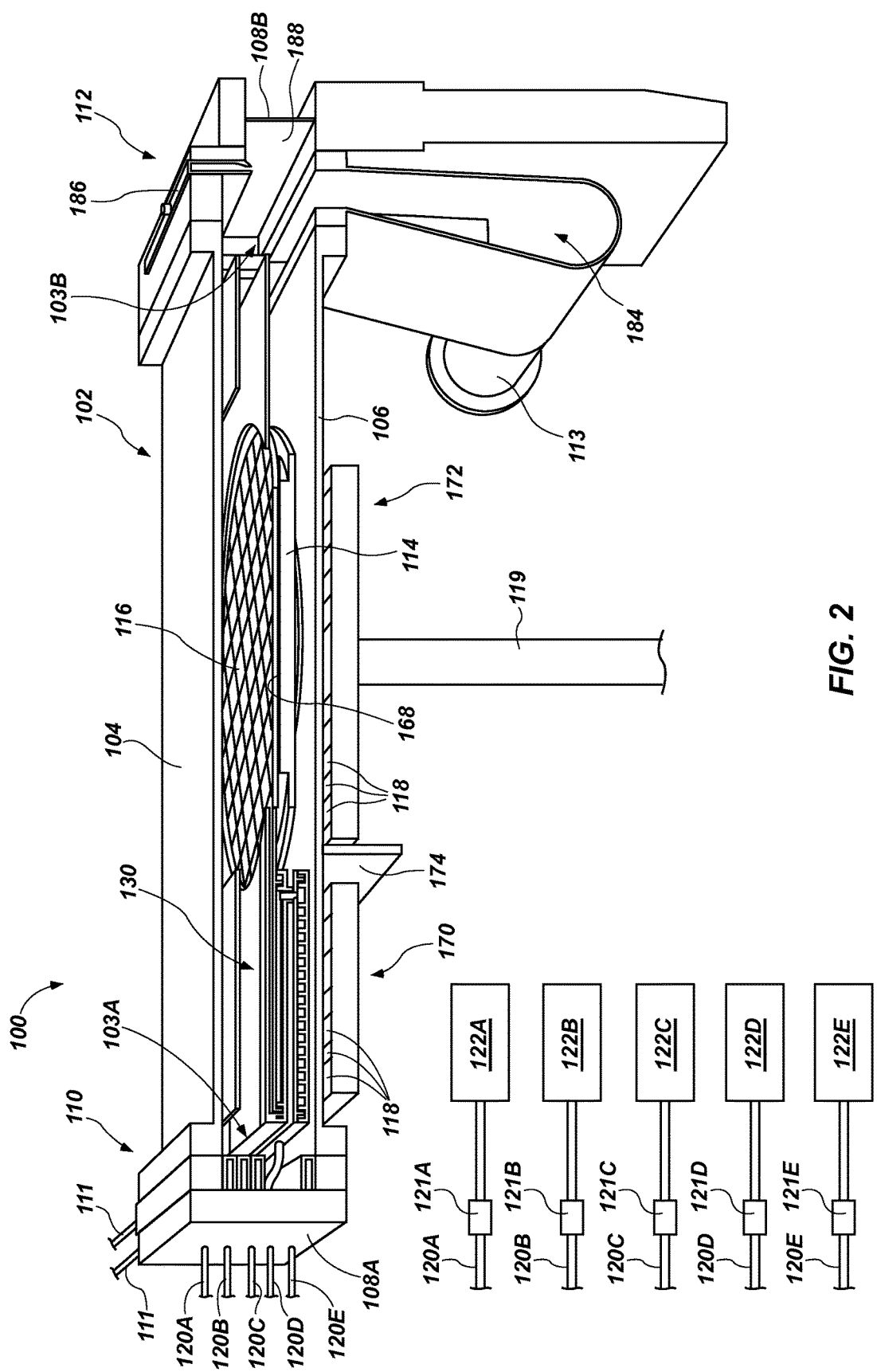
FIG. 2 is a cut-away perspective view illustrating elements of an example of a deposition system according to the schematic diagram of FIG. 1A.

FIG. 2 is a cut-away perspective view illustrating elements of an example of a deposition system 100 according to the schematic diagram of FIG. 1A. The deposition system 100 includes a reaction chamber 102. The reaction chamber 102 may be defined by a top wall 104, a bottom wall 106, and one or more side walls. One or more of the side walls may be defined by a component or components of subassemblies of the deposition system 100. For example, a first side wall 108A may comprise a component of a gas injection manifold 110 used for injecting one or more process gases into the reaction chamber 102, and a second side wall 108B may comprise a component of a venting and loading subassembly 112 used for venting process gases out from the reaction chamber 102, as well as for loading substrates into the reaction chamber 102 and unloading substrates out from the reaction chamber 102.

In some embodiments, the reaction chamber 102 may have the geometric shape of an elongated rectangular prism, as shown in FIG. 2. In some such embodiments, the gas injection manifold 110 may be located at a first end of the reaction chamber 102, and the venting and loading subassembly 112 may be located at an opposing, second end of the reaction chamber 102. In other embodiments, the reaction chamber 102 may have another geometric shape.

The deposition system 100 includes a substrate support structure 114 (e.g., a susceptor) configured to support one or more workpiece substrates 116 on which it is desired to deposit or otherwise provide semiconductor material within the deposition system 100. For example, the workpiece substrates 116 may comprise dies or wafers. The deposition system 100 further includes heating elements 118, which may be used to selectively heat the reaction chamber 102 such that an average temperature within the reaction chamber 102 may be controlled to within desirable elevated temperatures during deposition processes. The heating elements 118 may comprise, for example, resistive heating elements or radiant heating elements (e.g., heating lamps).

As shown in FIG. 2, the substrate support structure 114 may be coupled to a spindle 119, which may be coupled (e.g., directly structurally coupled, magnetically coupled, etc.) to a drive device (not shown), such as an electrical motor that is configured to drive rotation of the spindle 119 and, hence, the substrate support structure 114 within the reaction chamber 102.

In some embodiments, one or more of the top wall 104, the bottom wall 106, the substrate support structure 114, the spindle 119, and any other components within the reaction chamber 102 may be at least substantially comprised of a refractory ceramic material such as a ceramic oxide (e.g., silica (quartz), alumina, zirconia, etc.), a carbide (e.g., silicon carbide, boron carbide, etc.), or a nitride (e.g., silicon nitride, boron nitride, etc.). As a non-limiting example, the top wall 104, the bottom wall 106, the substrate support structure 114, and the spindle 119 may comprise transparent quartz so as to allow thermal energy radiated by the heating elements 118 to pass therethrough and heat process gases within the reaction chamber 102.

The deposition system 100 further includes a gas flow system used to flow process gases through the reaction chamber 102, such as the precursor vapor generated by the vaporizer 27 (FIG. 1A). For example, the deposition system 100 may comprise at least one gas injection manifold 110 for injecting one or more process gases into the reaction chamber 102 at a first location 103A, and a vacuum device 113 for drawing the one or more process gases through the reaction chamber 102 from the first location 103A to a second location 103B and for evacuating the one or more process gases out from the reaction chamber 102 at the second location 103B. The gas injection manifold 110 may comprise connectors configured to couple with conduits carrying one or more process gases.

With continued reference to FIG. 2, the deposition system 100 may include five gas inflow conduits 120A-120E that carry gases from respective process gas sources 122A-122E to the gas injection manifold 110. One of the gas inflow conduits 120A-120E may comprise the conduit 28 of FIG. 1A, and one of the gas sources 122A-122E may comprise the source 22 of precursor liquid 23 and the vaporizer 27 of FIG. 1A. Optionally, gas valves (121A-121E) may be used to selectively control the flow of gas through the gas inflow conduits 120A-120E, respectively.

As described herein, the flux of precursor gas (e.g., $GaCl_3$) vapor into the reaction chamber 102 may be controlled by metering and controlling the flow of precursor liquid 23 while it is in the liquid state, prior to vaporizing the precursor liquid 23 to form precursor vapor that flows into the reaction chamber 102, which may provide certain advantages over previously known systems in which the flux of precursor gas (e.g., $GaCl_3$) vapor into the reaction chamber 102 was controlled by metering and controlling the precursor vapor itself.

In additional embodiments, the deposition system 100 may include less than five (e.g., one to four) gas inflow conduits and respective gas sources, or the deposition system 100 may include more than five (e.g., six, seven, eight, etc.) gas inflow conduits and respective gas sources.

Figure 3:
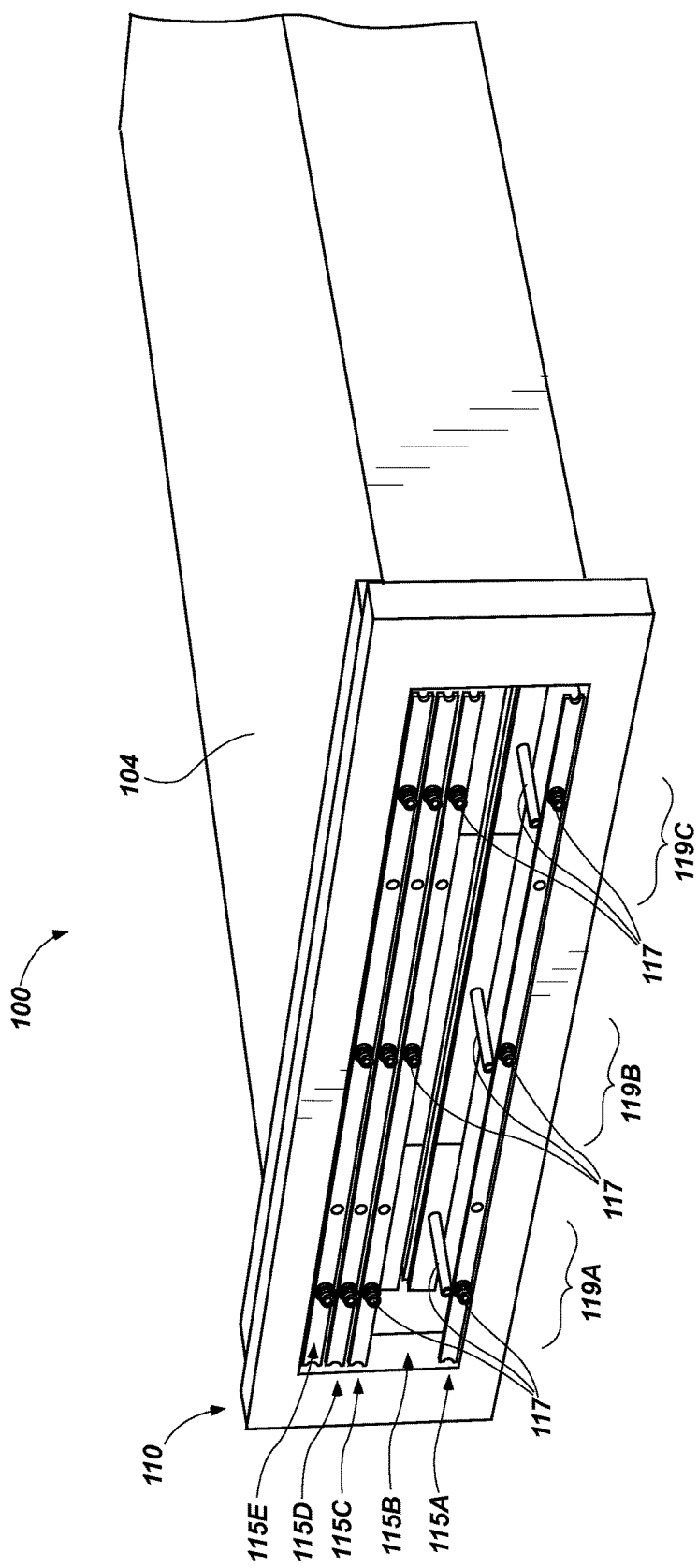
FIG. 3 is a perspective view of a front exterior surface of a gas injection device of the deposition system of FIG. 2.

FIG. 3 is a perspective view illustrating an exterior surface of the gas injection manifold 110. As shown in FIG. 3, the gas injection manifold 110 may comprise a plurality of connectors 117, which are configured for connection to the gas inflow conduits 120A-120E (FIG. 2). In some embodiments, the gas injection manifold 110 may comprise a plurality of rows 115A-115E of the connectors 117. Each of the rows 115A-115E may be configured to inject respective process gases into the reaction chamber 102 (FIG. 2). For example, the connectors 117 in a first bottom row 115A may be used for injecting a purge gas into the reaction chamber 102, the connectors 117 in a second row 115B may be used for injecting a precursor gas (e.g., $GaCl_3$) into the reaction chamber 102, the connectors 117 in a third row 115C may be used for injecting another precursor gas (e.g., $NH_3$) into the reaction chamber 102, the connectors 117 in a fourth row 115D may be used for injecting another process gas (e.g., $SiH_4$) into the reaction chamber 102, and the connectors 117 in a top fifth row 115E may be used for injecting a purge gas or a carrier gas (e.g., $N_2$) into the reaction chamber 102. The connectors 117 may be grouped into separate zones 119A-119C of connectors 117, each zone 119A-119C including connectors 117 from each of the rows 115A-115E. The connectors 117 in each zone 119A-119C may be used to convey process gases to different zones within the reaction chamber 102, thereby allowing differing process gas compositions and/or concentrations to be introduced into different regions within the reaction chamber 102 over the workpiece substrate 116.

Referring again to FIG. 2, the venting and loading subassembly 112 may comprise a vacuum chamber 184 into which gases flowing through the reaction chamber 102 are drawn by the vacuum and vented out from the reaction chamber 102. The vacuum within the vacuum chamber 184 is generated by the vacuum device 113. As shown in FIG. 2, the vacuum chamber 184 may be located below the reaction chamber 102.

The venting and loading subassembly 112 may further comprise a purge gas curtain device 186 that is configured and oriented to provide a generally planar curtain of flowing purge gas, which flows out from the purge gas curtain device 186 and into the vacuum chamber 184. The venting and loading subassembly 112 also may include an access gate 188, which may be selectively opened for loading and/or unloading workpiece substrates 116 from the substrate support structure 114, and selectively closed for processing of the workpiece substrates 116 using the deposition system 100. In some embodiments, the access gate 188 may comprise at least one plate configured to move between a closed first position and an open second position. The reaction chamber 102 may be at least substantially enclosed, and access to the substrate support structure 114 through the access gate 188 may be precluded, when the plate of the access gate 188 is in the closed first position. Access to the substrate support structure 114 may be enabled through the access gate 188 when the plate of the access gate 188 is in the open second position.

The purge gas curtain emitted by the purge gas curtain device 186 may reduce or prevent unwanted deposition (e.g., parasitic deposition) on the plate of the access gate 188.

Gaseous byproducts, carrier gases, and any excess precursor gases may be exhausted out from the reaction chamber 102 through the venting and loading subassembly 112.

The access gate 188 may be located remote from the first location 103A at which one or more process gases are injected into the reaction chamber 102. In some embodiments, the first location 103A may be disposed on a first side of the substrate support structure 114, and the second location 103B at which process gases are evacuated out from the reaction chamber 102 through the vacuum device 113 may be disposed on an opposing, second side of the support structure 114, as shown in FIG. 2. Additionally, the second location 103B at which process gases are evacuated out from the reaction chamber 102 may be disposed between the substrate support structure 114 and the access gate 188. The purge gas curtain device 186 may be configured to form a curtain of flowing purge gas that flows between the purge gas injection device and the vacuum device 113, as previously discussed. The curtain of flowing purge gas may be disposed between the workpiece support structure 114 and the access gate 188, so as to form a barrier of flowing purge gas that separates the workpiece substrates 116 from the access gate 188. Such a barrier of flowing purge gas may reduce or prevent parasitic deposition on the access gate 188 when the access gate 188 is closed.

As previously mentioned, in some embodiments, the deposition system 100 may include a precursor gas furnace 130 configured to increase the temperature of a precursor gas, such as a precursor gas generated by the vaporizer 27 (FIG. 1A). In some embodiments, the gas furnace 130 may be disposed within the reaction chamber 102. The precursor gas furnace 130 may be configured for heating precursor gas and conveying the precursor gas within the reaction chamber 102 from the gas injection manifold 110 to a location proximate the substrate support structure 114.

Figure 4:
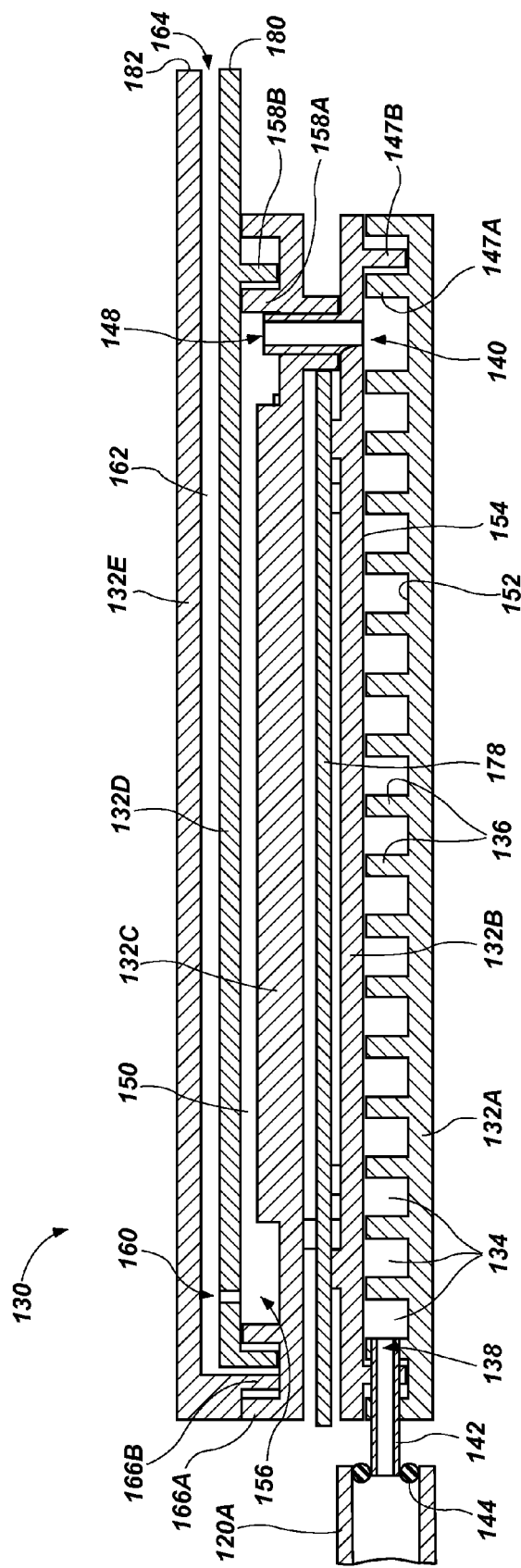
FIG. 4 is a cross-sectional side view of an internal precursor gas furnace of the deposition system of FIG. 2.

FIG. 4 is a cross-sectional side view of the precursor gas furnace 130 of FIG. 2. The furnace 130 of the embodiment of FIG. 4 comprises five (5) generally plate-shaped structures 132A-132E that are attached together and are sized and configured to define one or more precursor gas flow paths extending through the furnace 130 in chambers defined between the generally plate-shaped structures 132A-132E. The generally plate-shaped structures 132A-132E may comprise, for example, transparent quartz so as to allow thermal energy radiated by the heating elements 118 (FIG. 2) to pass through the plate-shaped structures 132A-132E and heat precursor gas or gases in the furnace 130.

As shown in FIG. 4, the first plate-shaped structure 132A and the second plate shaped structure 132B may be coupled together to define a chamber 134 therebetween. A plurality of integral ridge-shaped protrusions 136 on the first plate-shaped structure 132A may subdivide the chamber 134 into one or more flow paths extending from an inlet 138 into the chamber 134 to an outlet 140 from the chamber 134.

Figure 5:
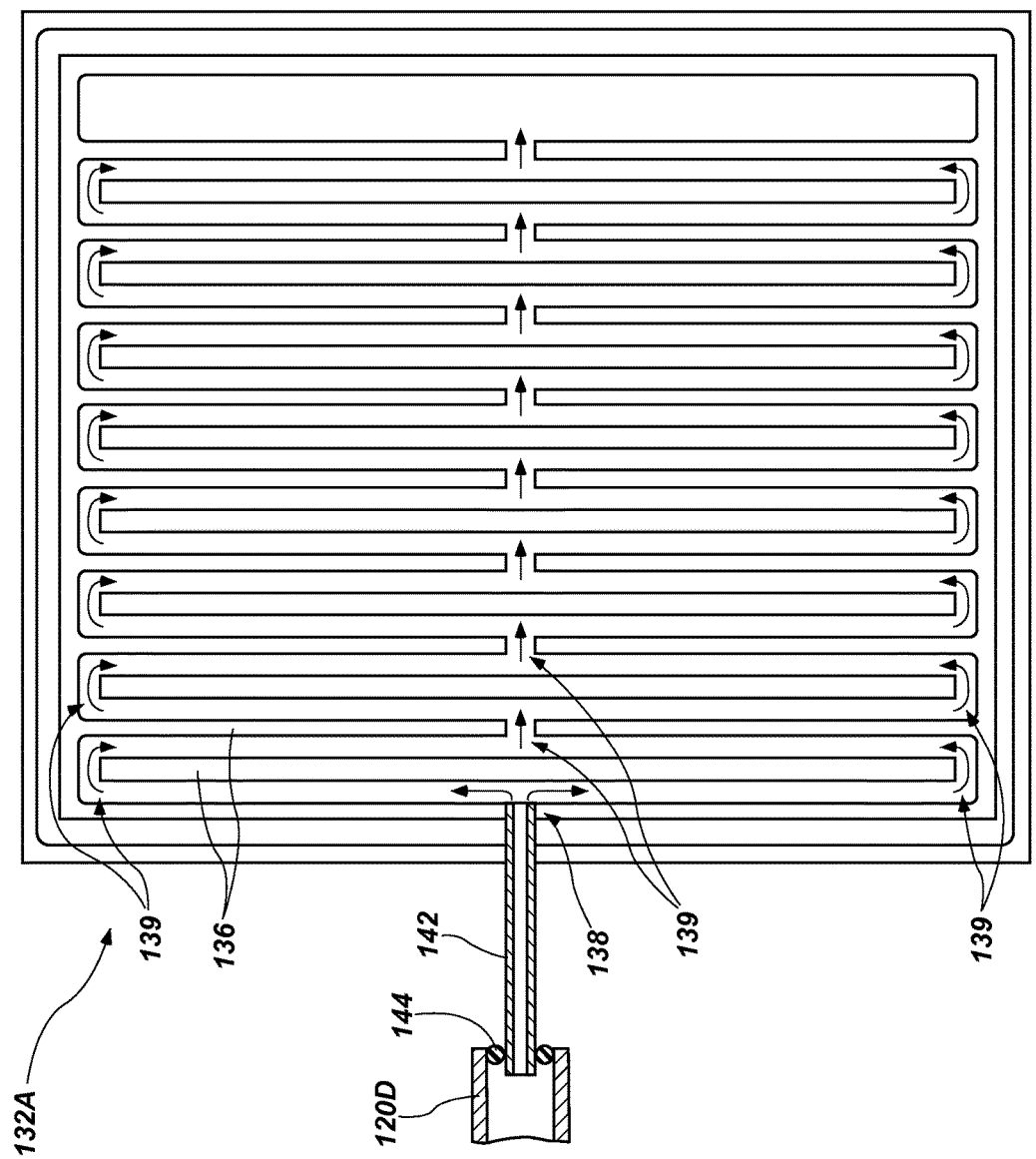
FIG. 5 is a top plan view of one of the generally plate-shaped structures of the internal precursor gas furnace of FIGS. 3 and 4.

FIG. 5 is a top plan view of the first plate-shaped structure 132A and illustrates the ridge-shaped protrusions 136 thereon and the flow paths that are defined in the chamber 134 (FIG. 4) thereby. As shown in FIG. 5, the protrusions 136 define sections of the flowpath extending through the furnace 130 (FIG. 4) that have a serpentine configuration. The protrusions 136 may comprise alternating walls having apertures 139 therethrough at the lateral ends of the protrusions 136 and at the center of the protrusions 136, as shown in FIG. 5. Thus, in this configuration, gases may enter the chamber 134 proximate a central region of the chamber 134 as shown in FIG. 5, flow laterally outward toward the lateral sides of the furnace 130, through apertures 138 at the lateral ends of one of the protrusions 136, back toward the central region of the chamber 134, and through another aperture 138 at the center of another protrusion 136. This flow pattern is repeated until the gases reach an opposing side of the first plate-shaped structure 132A from the inlet 138 after flowing through the chamber 134 back and forth in a serpentine manner.

By causing one or more precursor gases to flow through this section of the flow path extending through the furnace 130, the residence time of the one or more precursor gases within the furnace 130 may be selectively increased.

Referring again to FIG. 4, the inlet 138 leading into the chamber 134 may be defined by, for example, a tubular member 142. One of the gas inflow conduits 120A-120E, such as the gas inflow conduit 120A, may extend to and couple with the tubular member 142, as shown in FIG. 4. A seal member 144, such as a polymeric O-ring, may be used to form a gas-tight seal between the gas inflow conduit 120B and the tubular member 142. The tubular member 142 may comprise, for example, opaque quartz material so as to prevent thermal energy emitted from the heating elements 118 from heating the seal member 144 to elevated temperatures that might cause degradation of the seal member 144. Additionally, the cooling of the gas injection manifold 110 (FIG. 2) using flow of cooling fluid through the cooling conduits 111 may prevent excessive heating and resulting degradation of the seal member 144. By maintaining the temperature of the seal member 144 below about 200° C., an adequate seal may be maintained between one of the gas inflow conduits 120A-120E and the tubular member 142 using the seal member 144 when the gas inflow conduit (e.g., gas inflow conduit 120A) comprises a metal or metal alloy (e.g., steel) and the tubular member 142 comprises a refractory material such as quartz. The tubular member 142 and the first plate-shaped structure 132A may be bonded together so as to form a unitary, integral quartz body.

As shown in FIG. 4, the plate-shaped structures 132A, 132B may include complementary sealing features 147A, 147B (e.g., a ridge and a corresponding recess) that extend about the periphery of the plate-shaped structures 132A, 132B and at least substantially hermetically seal the chamber 134 between the plate-shaped structures 132A, 132B. Thus, gases within the chamber 134 are prevented from flowing laterally out from the chamber 134, and are forced to flow from the chamber 134 through an outlet 140 from the chamber 134.

Optionally, the protrusions 136 may be configured to have a height that is slightly less than a distance separating a surface 152 of the first plate-shaped structure 132A from which the protrusions 136 extend and an opposing surface 154 of the second plate-shaped structure 132B. Thus, a small gap may be provided between the protrusions 136 and the surface 154 of the second plate-shaped structure 132B. Although a minor amount of gas may leak through these gaps, this small amount of leakage will not detrimentally affect the average residence time for the precursor gas molecules within the chamber 140. By configuring the protrusions 136 in this manner, variations in the height of the protrusions 136 that arise due to tolerances in the manufacturing processes used to form the plate-shaped structures 132A, 132B can be accounted for, such that protrusions 136 that are inadvertently fabricated to have excessive height do not prevent the formation of an adequate seal between the plate-shaped structures 132A, 132B by the complementary sealing features 147A, 147B.

As shown in FIG. 4, the outlet 140 from the chamber 134 between the plate-shaped structures 132A, 132B leads to an inlet 148 to a chamber 150 between the third plate-shaped structure 132C and the fourth plate-shaped structure 132D. The chamber 150 may be configured such that the gas or gases therein flow from the inlet 148 toward an outlet 156 from the chamber 150 in a generally linear manner. For example, the chamber 150 may have a cross-sectional shape that is generally rectangular and uniform in size between the inlet 148 and the outlet 156. Thus, the chamber 150 may be configured to render the flow of gas or gases more laminar, as opposed to turbulent.

The plate-shaped structures 132C, 132D may include complementary sealing features 158A, 158B (e.g., a ridge and a corresponding recess) that extend about the periphery of the plate-shaped structures 132C, 132D and at least substantially hermetically seal the chamber 150 between the plate-shaped structures 132C, 132D. Thus, gases within the chamber 150 are prevented from flowing laterally out from the chamber 150, and are forced to flow from the chamber 150 through the outlet 156.

The outlet 156 may comprise, for example, an elongated aperture (e.g., a slot) extending through the plate-shaped structure 132D proximate an opposing end thereof from the end that is proximate the inlet 148.

With continued reference to FIG. 4, the outlet 156 from the chamber 150 between the plate-shaped structures 132C, 132D leads to an inlet 160 to a chamber 162 between the fourth plate-shaped structure 132D and the fifth plate-shaped structure 132E. The chamber 162 may be configured such that the gas or gases therein flow from the inlet 160 toward an outlet 164 from the chamber 162 in a generally linear manner. For example, the chamber 162 may have a cross-sectional shape that is generally rectangular and uniform in size between the inlet 160 and the outlet 164. Thus, the chamber 162 may be configured to render the flow of gas or gases more laminar, as opposed to turbulent, in a manner like that previously described with reference to the chamber 150.

The plate-shaped structures 132D, 132E may include complementary sealing features 166A, 166B (e.g., a ridge and a corresponding recess) that extend about a portion of the periphery of the plate-shaped structures 132D, 132E and seal the chamber 162 between the plate-shaped structures 132D, 132E on all but one side of the plate-shaped structures 132D, 132E. A gap is provided between the plate-shaped structures 132D, 132E on the side thereof opposite the inlet 160, which gap defines the outlet 164 from the chamber 162. Thus, gases enter the chamber 162 through the inlet 160, flow through the chamber 162 toward the outlet 164 (while being prevented from flowing laterally out from the chamber 162 by the complementary sealing features 166A, 166B), and flow out from the chamber 162 through the outlet 164. The sections of the gas flow path or paths within the furnace 130 that are defined by the chamber 150 and the chamber 162 are configured to impart laminar flow to the one or more precursor gases caused to flow through the flow path or paths within the furnace 130, and reduce any turbulence therein.

Figure 6:
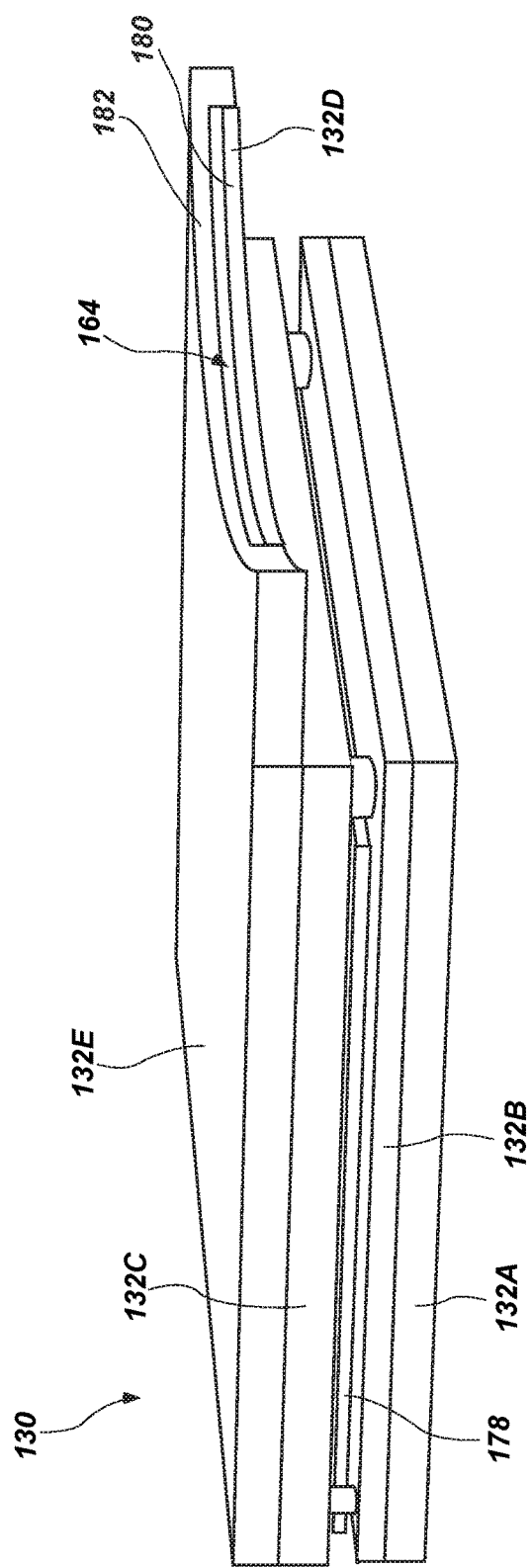
FIG. 6 is a perspective view of an internal precursor gas furnace of the deposition system of FIG. 2.

The outlet 164 is configured to output one or more precursor gases from the furnace 130 into the interior region within the reaction chamber 102 (FIG. 2). FIG. 6 is a perspective view of the furnace 130, and illustrates the outlet 164. As shown in FIG. 6, the outlet 164 may have a rectangular cross-sectional shape, which may assist in preserving laminar flow of the precursor gas or gases being injected out from the furnace 130 and into the interior region within the reaction chamber 102 (FIG. 2). The outlet 164 may be sized and configured to output a sheet of flowing precursor gas in a transverse direction over an upper surface 168 of the substrate support structure 114 (see FIG. 2). As shown in FIG. 6, an end surface 180 of the fourth generally plate-shaped structure 132D and an end surface 182 of the fifth generally plate-shaped structure 132E, a gap between which defines the outlet 164 from the chamber 162 as previously discussed, may have a shape that generally matches a shape of a workpiece substrate 116 supported on the substrate support structure 114 and on which a material is to be deposited using the precursor gas or gases flowing out from the furnace 130. For example, in embodiments in which the workpiece substrate 116 comprises a die or wafer having a periphery that is generally circular in shape, the surfaces 180, 182 may have an arcuate shape that generally matches the profile of the outer periphery of the workpiece substrate 116 to be processed. In such a configuration, the distance between the outlet 164 and the outer edge of the workpiece substrate 116 may be generally constant across the outlet 164. In this configuration, the precursor gas or gases flowing out from the outlet 164 are prevented from mixing with other precursor gases within the reaction chamber 102 (FIG. 2) until they are located in the vicinity of the surface of the workpiece substrate 116 on which material is to be deposited by the precursor gases, and avoiding unwanted deposition of material on components of the deposition system 100.

Referring again to FIG. 2, the deposition system 100 may include heating elements 118. For example, the heating elements 118 may comprise a first group 170 of heating elements 118 and a second group 172 of heating elements 118. The first group 170 of heating elements 118 may be located and configured for imparting thermal energy to the furnace 130 and heating the precursor gas therein. For example, the first group 170 of heating elements 118 may be located below the reaction chamber 102 under the furnace 130, as shown in FIG. 2. In additional embodiments, the first group 170 of heating elements 118 may be located above the reaction chamber 102 over the furnace 130, or may include both heating elements 118 located below the reaction chamber 102 under the furnace 130 and heating elements 118 located above the reaction chamber 102 over the furnace 130. The second group 172 of heating elements 118 may be located and configured for imparting thermal energy to the substrate support structure 114 and any workpiece substrate 116 supported thereon. For example, the second group 172 of heating elements 118 may be located below the reaction chamber 102 under the substrate support structure 114, as shown in FIG. 2. In additional embodiments, the second group 172 of heating elements 118 may be located above the reaction chamber 102 over the substrate support structure 114, or may include both heating elements 118 located below the reaction chamber 102 under the substrate support structure 114 and heating elements 118 located above the reaction chamber 102 over the substrate support structure 114.

The first group 170 of heating elements 118 may be separated from the second group 172 of heating elements 118 by a thermally reflective or thermally insulating barrier 174. By way of example and not limitation, such a barrier 174 may comprise a gold-plated metal plate located between the first group 170 of heating elements 118 and the second group 172 of heating elements 118. The metal plate may be oriented to allow independently controlled heating of the furnace 130 (by the first group 170 of heating elements 118) and the substrate support structure 114 (by the second group 172 of heating elements 118). In other words, the barrier 174 may be located and oriented to reduce or prevent heating of the substrate support structure 114 by the first group 170 of heating elements 118, and to reduce or prevent heating of the furnace 130 by the second group 172 of heating elements 118.

The first group 170 of heating elements 118 may comprise a plurality of rows of heating elements 118, which may be controlled independently from one another. In other words, the thermal energy emitted by each row of heating elements 118 may be independently controllable. The rows may be oriented transverse to the direction of the net flow of gas through the reaction chamber 102, which is the direction extending from left to right from the perspective of FIG. 2. Thus, the independently controlled rows of heating elements 118 may be used to provide a selected thermal gradient across the furnace 130, if so desired. Similarly, the second group 172 of heating elements 118 also may comprise a plurality of rows of heating elements 118, which may be controlled independently from one another. Thus, a selected thermal gradient also may be provided across the substrate support structure 114, if so desired.

Optionally, passive heat transfer structures (e.g., structures comprising materials that behave similarly to a black body) may be located adjacent or proximate to at least a portion of the precursor gas furnace 130 within the reaction chamber 102 to improve transfer of heat to the precursor gases within the furnace 130.

Passive heat transfer structures (e.g., structures comprising materials that behave similarly to a black body) may be provided within the reaction chamber 102 as disclosed in, for example, U.S. Patent Application Publication No. US 2009/0214785 A1, which published on Aug. 27, 2009 in the name of Arena et al., the entire disclosure of which is incorporated herein by reference. By way of example and not limitation, the precursor gas furnace 130 may include a passive heat transfer plate 178, which may be located between the second plate-shaped structure 132B and the third plate-shaped structure 132C, as shown in FIG. 4. Such a passive heat transfer plate 178 may improve the transfer of heat provided by the heating elements 118 to the precursor gas within the furnace 130, and may improve the homogeneity and consistency of the temperature within the furnace 130. The passive heat transfer plate 178 may comprise a material with high emissivity values (close to unity) (black body materials) that is also capable of withstanding the high temperature, corrosive environment that may be encountered within the reaction chamber 102. Such materials may include, for example, aluminum nitride (AlN), silicon carbide (SiC), and boron carbide ($B_4C$), which have emissivity values of 0.98, 0.92, and 0.92, respectively. Thus, the passive heat transfer plate 178 may absorb thermal energy emitted by the heating elements 118, and re-emit the thermal energy into the furnace 130 and the precursor gas or gases therein.

Figure 7:
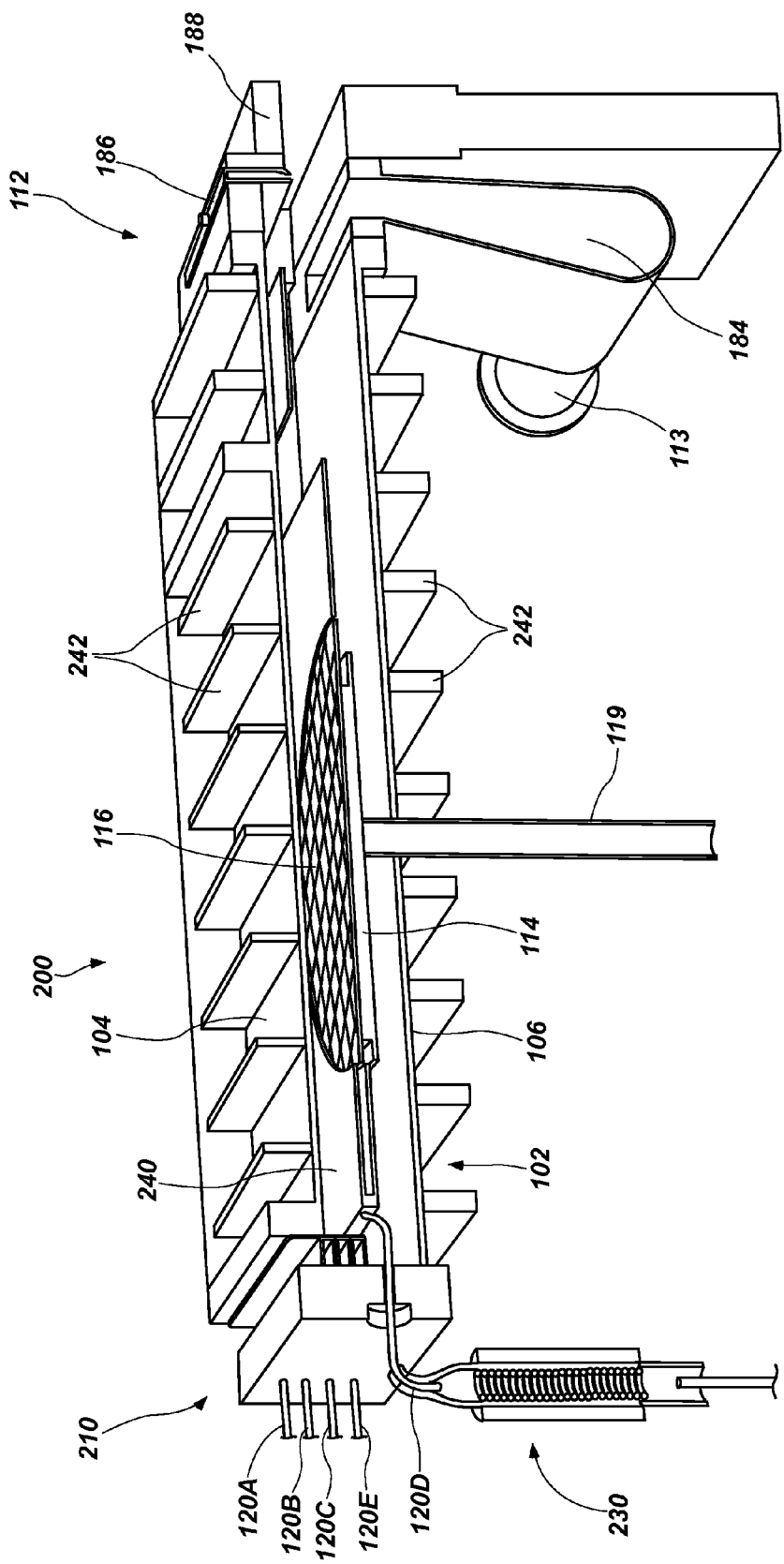
FIG. 7 is a cut-away perspective view schematically illustrating another example embodiment of a deposition system that includes an access gate located remotely from a location at which process gases are injected into the reaction chamber, but including an external precursor gas injector instead of an internal precursor gas furnace.

FIG. 7 is a cut-away perspective view schematically illustrating components of another example embodiment of a deposition system 200 in accordance with the schematic diagram of FIG. 1A. The deposition system 200 is similar to the deposition system 100 of FIG. 2. The deposition system 200, however, does not include an internal precursor gas furnace 130, but rather includes an external precursor gas injector 230 located outside the reaction chamber 102. The external precursor gas injector 230 may be configured for heating at least one precursor gas, which may be supplied by a vaporizer 27 as previously described with reference to FIG. 1A, and conveying the at least one precursor gas to a gas injection manifold 210, which may be substantially similar to the gas injection manifold 110 of FIG. 2.

By way of example and not limitation, the external precursor gas injector 230 may comprise a precursor gas injector as described in any of provisional U.S. Patent Application Ser. No. 61/416,525, filed Nov. 23, 2010 and entitled "Methods of Forming Bulk III-Nitride Materials on Metal-Nitride Growth Template Layers, and Structures formed by Such Methods," U.S. Patent Application Publication No. US 2009/0223442 A1, which published Sep. 10, 2009 in the name of Arena et al., International Publication Number WO 2010/101715 A1, published Sep. 10, 2010 and entitled "Gas Injectors for CVD Systems with the Same," U.S. patent application Ser. No. 12/894,724, which was filed Sep. 30, 2010, now U.S. Pat. No. 8,486,192, issued Jul. 16, 2013, in the name of Bertram, and U.S. patent application Ser. No. 12/895,311, which was filed Sep. 30, 2010, now U.S. Pat. No. 8,133,806, issued Mar. 13, 2012, in the name of Werkhoven, the disclosures of which are hereby incorporated herein in their entireties by this reference.

The gas injector 230 may comprise a thermalizing gas injector including an elongated conduit, which may have a coiled configuration, a serpentine configuration, etc., in which the one or more process gases flowing therethrough (e.g., a precursor gas) are heated as they flow through the elongated conduit. External heating elements may be used to heat the process gas or gases as they flow through the elongated conduit. Optionally, one or more passive heating structures (like those previously described herein) may be incorporated into the gas injector 230 to improve the heating of the process gas or gases flowing through the gas injector 230.

Optionally, the gas injector 230 may further include a reservoir configured to hold a liquid reagent for reacting with a process gas (or a decomposition or reaction product of a process gas). For example, the reservoir may be configured to hold a liquid metal or other element, such as, for example, liquid gallium (Ga), liquid aluminum (Al), or liquid indium (In). In further embodiments of the invention, the reservoir may be configured to hold a solid reagent for reacting with a process gas (or a decomposition or reaction product of a process gas). For example, the reservoir may be configured to hold a solid volume of one or more materials, such as, for example, solid silicon (Si) or solid magnesium (Mg).

With continued reference to FIG. 7, the process gas or gases that are injected into the reaction chamber 102 from the external precursor gas injector 230 may be carried through an interior region within the reaction chamber 102 within an enclosure 240 to a location proximate the workpiece support structure 114, so as to avoid such process gas or gases from mixing with other process gas or gases until they are in the vicinity of a workpiece substrate 116 supported on the substrate support structure 114.

In additional embodiments, the deposition systems may include both an internal precursor gas furnace 130 as described with reference to FIG. 2, as well as an external precursor gas injector 230, as described with reference to FIG. 7. For example, the enclosure 240 shown in FIG. 7 could be replaced with the internal precursor gas furnace 130 of FIG. 2.

As shown in FIG. 7, the reaction chamber 102 may further include structural support ribs 242, which may be used to provide structural rigidity to the reaction chamber 102. Such support ribs 242 may be comprise a refractory material like that of the top wall 104 and bottom wall 106 of the reaction chamber 102. The reaction chamber 102 of FIG. 2 could also include such structural support ribs 242 in additional embodiments.

Although not illustrated in the figures, the deposition systems described herein also may include at least one robotic arm device configured to robotically load workpiece substrates 116 into the reaction chamber 102 through the access gate 188 and to unload workpiece substrates 116 out from the reaction chamber 102 through the access gate 188. Such robotic arm devices are known in the art.

Embodiments of depositions systems as described herein may be used to deposit semiconductor material on a workpiece substrate 116 in accordance with further embodiments of the disclosure.

Referring again to FIG. 1A, the meter device 30 and the flow control device 32 may be used to meter and control a flow rate of a precursor liquid 23 from a source 22 of the precursor liquid 23 into the vaporizer 27. The precursor liquid 23 may be vaporized within the vaporizer 27 to form a first precursor vapor. The first precursor vapor may be caused to flow out from the vaporizer 27 to a region proximate a surface of a workpiece substrate 16 within the reaction chamber 12. A second precursor vapor may be caused to flow into the reaction chamber 12 separately from the first precursor vapor, and a compound semiconductor material may be deposited on the surface of the workpiece substrate 16 within the reaction chamber 12. The compound semiconductor material may comprise at least one element from the first precursor vapor and at least one element from the second precursor vapor.

As previously mentioned, in some embodiments, the meter device 30 may be separate from the flow control device 32. Thus, in some embodiments, the flow rate of the precursor liquid 23 may be metered with the meter device 30, and the flow rate of the precursor liquid 23 may be separately controlled with a flow control device 32 separate from the meter device 30. In other embodiments, the flow rate of the precursor liquid 23 may be metered and controlled with a single unitary device.

A temperature of the precursor liquid 23 may be maintained within a range extending from about 83° C. to about 150° C. between the source 22 of precursor liquid 23 and the vaporizer 27. More particularly, temperature of the precursor liquid 23 may be maintained within a range extending from about 85° C. to about 120° C., or even between about 90° C. and about 100° C. between the source 22 and the vaporizer 27. Further, as previously mentioned, the precursor liquid 23 may be caused to flow from the source 22 to the vaporizer 27 without decreasing a temperature of the precursor liquid 23. In such embodiments, a temperature of the precursor liquid 23 may be increased as the precursor liquid 23 flows from the source 22 to the vaporizer 27. The precursor liquid 23 may be heated within the vaporizer 27 from a temperature of about 150° C. or less to at least about 400° C. to form a precursor vapor. More particularly, the precursor liquid 23 may be heated within the vaporizer 27 to a temperature of at least about 850° C. (e.g., about 900° C.) in some embodiments.

Additional non-limiting example embodiments are set forth below.

Embodiment 1: A method of depositing a compound semiconductor material on a substrate, comprising: metering and controlling a flow rate of a precursor liquid from a source of the precursor liquid into a vaporizer, the precursor liquid comprising at least one of $GaCl_3$, $InCl_3$, and $AlCl_3$ in a liquid state; vaporizing the precursor liquid within the vaporizer to faun a first precursor vapor; flowing the first precursor vapor out from the vaporizer to a region proximate a surface of a workpiece substrate within a reaction chamber; separately flowing a second precursor vapor into the reaction chamber; and depositing a compound semiconductor material on the surface of the workpiece substrate within the reaction chamber, the compound semiconductor material comprising at least one element from the first precursor vapor and at least one element from the second precursor vapor.

Embodiment 2: The method of Embodiment 1, wherein metering and controlling the flow rate of the precursor liquid into the vaporizer comprises metering the flow rate with a first device, and controlling the flow rate with a second device separate from the first device.

Embodiment 3: The method of Embodiment 1, wherein metering and controlling the flow rate of the precursor liquid into the vaporizer comprises metering and controlling the flow rate with a single unitary device.

Embodiment 4: The method of any one of Embodiments 1 through 3, further comprising maintaining a temperature of the precursor liquid within a range extending from about 83° C. to about 150° C. between the liquid source and the vaporizer.

Embodiment 5: The method of Embodiment 4, wherein maintaining the temperature of the precursor liquid within the range extending from about 83° C. to about 150° C. between the liquid source and the vaporizer comprises maintaining a temperature of the precursor liquid within a range extending from about 85° C. to about 120° C. between the liquid source and the vaporizer.

Embodiment 6: The method of Embodiment 5, wherein maintaining the temperature of the precursor liquid within the range extending from about 85° C. to about 120° C. between the liquid source and the vaporizer comprises maintaining a temperature of the precursor liquid within a range extending from about 90° C. to about 100° C. between the liquid source and the vaporizer.

Embodiment 7: The method of any one of Embodiments 4 through 6, further comprising flowing the precursor liquid from the liquid source to the vaporizer without decreasing a temperature of the precursor liquid.

Embodiment 8: The method of Embodiment 7, wherein flowing the precursor liquid from the liquid source to the vaporizer without decreasing the temperature of the precursor liquid comprises increasing a temperature of the precursor liquid as the precursor liquid flows from the liquid source to the vaporizer.

Embodiment 9: The method of any one of Embodiments 1 through 8, further comprising formulating the precursor liquid to comprise $GaCl_3$.

Embodiment 10: The method of any one of Embodiments 1 through 9, further comprising formulating the second precursor vapor to comprise nitrogen.

Embodiment 11: The method of Embodiment 10, wherein formulating the second precursor vapor to comprise nitrogen comprises formulating the second precursor vapor to comprise ammonia.

Embodiment 12: The method of any one of Embodiments 1 through 11, wherein depositing the compound semiconductor material comprises depositing at least one of gallium nitride, indium nitride, and aluminum nitride.

Embodiment 13: The method of any one of Embodiments 1 through 12, wherein vaporizing the precursor liquid within the vaporizer comprises vaporizing the precursor liquid within an interior region of the reaction chamber.

Embodiment 14: The method of any one of Embodiments 1 through 13, further comprising heating the precursor liquid within the vaporizer from a temperature of about 150° C. or less to at least about 400° C. to faun the first precursor vapor.

Embodiment 15: The method of Embodiment 14, further comprising heating the first precursor vapor within the vaporizer to a temperature of at least about 850° C.

Embodiment 16: A halide vapor phase epitaxy system, comprising: a reaction chamber including at least one substrate support structure within the reaction chamber; a source of a precursor liquid comprising at least one of $GaCl_3$, $InCl_3$, and $AlCl_3$ in a liquid state; a vaporizer configured to vaporize the precursor liquid to form a precursor vapor to be conveyed to a location proximate the substrate support structure within the reaction chamber; at least one conduit providing a fluid pathway between the source of the precursor liquid and the vaporizer; a device configured to meter a flow rate of the precursor liquid through the at least one conduit; and a device configured to control the flow rate of the precursor liquid through the at least one conduit.

Embodiment 17: The halide vapor phase epitaxy system of Embodiment 16, wherein the device configured to meter the flow rate of the precursor liquid through the at least one conduit and the device configured to control the flow rate of the precursor liquid through the at least one conduit are separate from one another.

Embodiment 18: The halide vapor phase epitaxy system of Embodiment 16 or Embodiment 17, further comprising at least one heating element configured to maintain the source of the precursor liquid at a temperature within a range extending from about 83° C. to about 150° C.

Embodiment 19: The halide vapor phase epitaxy system of any one of Embodiments 16 through 18, wherein the vaporizer is disposed outside the reaction chamber.

Embodiment 20: The halide vapor phase epitaxy system of any one of Embodiments 16 through 18, wherein the vaporizer is disposed at least partially within the reaction chamber.

Embodiment 21: The halide vapor phase epitaxy system of any one of Embodiments 16 through 20, wherein the vaporizer comprises at least one heating element configured to heat the precursor liquid from a first temperature in a range extending from about 83° C. to about 150° C. to a second temperature of at least about 400° C.

Embodiment 22: The halide vapor phase epitaxy system of any one of Embodiments 16 through 21, wherein the vaporizer comprises an atomizer configured to disperse the precursor liquid into droplets.

Embodiment 23: The halide vapor phase epitaxy system of any one of Embodiments 16 through 22, wherein the source of the precursor liquid comprising at least one of $GaCl_3$, $InCl_3$, and $AlCl_3$ in the liquid state comprises liquid $GaCl_3$.

Embodiment 24: The halide vapor phase epitaxy system of any one of Embodiments 16 through 23, further comprising a source of another precursor vapor comprising nitrogen.

Embodiment 25: The halide vapor phase epitaxy system of Embodiment 24, wherein the source of the another precursor vapor comprising nitrogen comprises a source of ammonia.

The embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternative useful combinations of the elements described, will become apparent to those skilled in the art from the description. Such modifications are also intended to fall within the scope of the appended claims.

What is claimed is:

1. A method of depositing a compound semiconductor material on a substrate using a halide vapor phase epitaxy system, comprising:

metering and controlling a flow rate of a precursor liquid from a source of the precursor liquid into a vaporizer, the precursor liquid comprising at least one of $GaCl_3$, $InCl_3$, and $AlCl_3$ in a liquid state;

maintaining a temperature of the precursor liquid within a range extending from about 90° C. to about 100° C. between the source of the precursor liquid and the vaporizer;

heating the precursor liquid within the vaporizer to at least about 400° C. and vaporizing the precursor liquid within the vaporizer to form a first precursor vapor;

flowing the first precursor vapor out from the vaporizer, through a precursor gas furnace disposed at least partially within a reaction chamber, and to a region proximate a surface of a workpiece substrate within the reaction chamber, the precursor gas furnace comprising:

a stack of plate-shaped structures;

a first chamber defined between two plate-shaped structures in the stack of plate-shaped structures, ridge-shaped protrusions on one of the two plate-shaped structures defining the first chamber subdividing the first chamber into one or more flowpaths for the first precursor vapor extending between an inlet to the first chamber at a first end of the precursor gas furnace and an outlet from the first chamber at a second opposing end of the precursor gas furnace, the one or more flowpaths in the first chamber having a serpentine configuration;

a second chamber defined between two plate-shaped structures in the stack of plate-shaped structures, the outlet of the first chamber leading to an inlet of the second chamber, the second chamber having a cross-sectional shape that is generally rectangular and uniform in size between the inlet of the second chamber and an outlet of the second chamber such that the flow of the first precursor vapor through the second chamber is generally laminar; and a third chamber defined between two plate-shaped structures in the stack of plate-shaped structures, the outlet of the second chamber leading to an inlet of the third chamber, the third chamber having a cross-sectional shape that is generally rectangular and uniform in size between the inlet of the third chamber and an outlet of the third chamber such that flow of the first precursor vapor through the third chamber is generally laminar;

separately flowing a second precursor vapor into the reaction chamber; and depositing a compound semiconductor material on the surface of the workpiece substrate within the reaction chamber, the compound semiconductor material comprising at least one element from the first precursor vapor and at least one element from the second precursor vapor.

2. The method of claim 1, wherein metering and controlling the flow rate of the precursor liquid into the vaporizer comprises metering the flow rate with a first device, and controlling the flow rate with a second device separate from the first device.

3. The method of claim 1, wherein metering and controlling the flow rate of the precursor liquid into the vaporizer comprises metering and controlling the flow rate with a single unitary device.

4. The method of claim 1, wherein maintaining the temperature of the precursor liquid within the range extending from about 83° C. to about 150° C. between the liquid source and the vaporizer comprises maintaining a temperature of the precursor liquid within a range extending from about 85° C. to about 120° C. between the liquid source and the vaporizer.

5. The method of claim 4, wherein maintaining the temperature of the precursor liquid within the range extending from about 85° C. to about 120° C. between the liquid source and the vaporizer comprises maintaining a temperature of the precursor liquid within a range extending from about 90° C. to about 100° C. between the liquid source and the vaporizer.

6. The method of claim 1, further comprising flowing the precursor liquid from the liquid source to the vaporizer without decreasing a temperature of the precursor liquid.

7. The method of claim 6, wherein flowing the precursor liquid from the liquid source to the vaporizer without decreasing the temperature of the precursor liquid comprises increasing a temperature of the precursor liquid as the precursor liquid flows from the liquid source to the vaporizer.

8. The method of claim 1, further comprising formulating the precursor liquid to comprise $GaCl_3$.

9. The method of claim 1, further comprising formulating the second precursor vapor to comprise nitrogen.

10. The method of claim 9, wherein formulating the second precursor vapor to comprise nitrogen comprises formulating the second precursor vapor to comprise ammonia.

11. The method of claim 1, wherein depositing the compound semiconductor material comprises depositing at least one of gallium nitride, indium nitride, and aluminum nitride.

12. The method of claim 1, wherein vaporizing the precursor liquid within the vaporizer comprises vaporizing the precursor liquid within an interior region of the reaction chamber.

13. The method of claim 1, further comprising heating the first precursor vapor within the vaporizer to a temperature of at least about 850° C.

14. A halide vapor phase epitaxy system, comprising:
- a reaction chamber including at least one substrate support structure within the reaction chamber;
- a source of a precursor liquid comprising at least one of $GaCl_3$, $InCl_3$, and $AlCl_3$ in a liquid state;
- a vaporizer vaporizing the precursor liquid and forming a precursor vapor conveyed to a location proximate the substrate support structure within the reaction chamber;
- at least one conduit providing a fluid pathway for the precursor liquid between the source of the precursor liquid and the vaporizer;
- a flow meter device metering a flow rate of the precursor liquid through the at least one conduit;
- a flow control device controlling the flow rate of the precursor liquid through the at least one conduit; and
- a precursor gas furnace disposed at least partially within the reaction chamber and in fluid communication with the vaporizer such that the precursor vapor formed by the vaporizer is communicated to the precursor gas furnace, the precursor gas furnace comprising:
  - a stack of plate-shaped structures;
  - a first chamber defined between two plate-shaped structures in the stack of plate-shaped structures, ridge-shaped protrusions on one of the two plate-shaped structures defining the first chamber subdividing the first chamber into one or more precursor gas flowpaths extending between an inlet to the first chamber at a first end of the precursor gas furnace and an outlet from the first chamber at a second opposing end of the precursor gas furnace, the one or more precursor gas flowpaths in the first chamber having a serpentine configuration;
  - a second chamber defined between two plate-shaped structures in the stack of plate-shaped structures, the outlet of the first chamber leading to an inlet of the second chamber, the second chamber having a cross-sectional shape that is generally rectangular and uniform in size between the inlet of the second chamber and an outlet of the second chamber such that gas flow through the second chamber is generally laminar; and
  - a third chamber defined between two plate-shaped structures in the stack of plate-shaped structures, the outlet of the second chamber leading to an inlet of the third chamber, the third chamber having a cross-sectional shape that is generally rectangular and uniform in size between the inlet of the third chamber and an outlet of the third chamber such that gas flow through the third chamber is generally laminar.

15. The halide vapor phase epitaxy system of claim 14, wherein the flow meter device metering the flow rate of the precursor liquid through the at least one conduit and the flow control device controlling the flow rate of the precursor liquid through the at least one conduit are separate from one another.

16. The halide vapor phase epitaxy system of claim 14, wherein the vaporizer is disposed outside the reaction chamber.

17. The halide vapor phase epitaxy system of claim 14, wherein the vaporizer is disposed at least partially within the reaction chamber.

18. The halide vapor phase epitaxy system of claim 14, wherein the vaporizer comprises an atomizer configured to disperse the precursor liquid into droplets.

19. The halide vapor phase epitaxy system of claim 14, further comprising a source of another precursor vapor comprising nitrogen.

20. The halide vapor phase epitaxy system of claim 19, wherein the source of the another precursor vapor comprising nitrogen comprises a source of ammonia.

21. The halide vapor phase epitaxy system of claim 14, further comprising at least one first heating element maintaining the precursor liquid at a first temperature within a first range extending from about 90° C. to about 100° C. between the source of the precursor liquid and the vaporizer.

22. The halide vapor phase epitaxy system of claim 21, wherein the vaporizer comprises at least one second heating element heating the precursor liquid from the first temperature in the first range to a second temperature of at least about 400° C.

* * * * *